US009224840B2

(12) United States Patent
Flachowsky et al.

(10) Patent No.: US 9,224,840 B2
(45) Date of Patent: Dec. 29, 2015

(54) REPLACEMENT GATE FINFET STRUCTURES WITH HIGH MOBILITY CHANNEL

(75) Inventors: Stefan Flachowsky, Dresden (DE); Ralf Illgen, Dresden (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 196 days.

(21) Appl. No.: 13/545,597

(22) Filed: Jul. 10, 2012

(65) Prior Publication Data

US 2014/0015055 A1     Jan. 16, 2014

(51) Int. Cl.
| H01L 27/088 | (2006.01) |
| H01L 21/20 | (2006.01) |
| H01L 29/66 | (2006.01) |
| H01L 29/78 | (2006.01) |
| H01L 29/10 | (2006.01) |

(52) U.S. Cl.
CPC ...... *H01L 29/66795* (2013.01); *H01L 29/1054* (2013.01); *H01L 29/66545* (2013.01); *H01L 29/7851* (2013.01)

(58) Field of Classification Search
CPC .............. H01L 21/823431; H01L 21/823821; H01L 21/845; H01L 27/0886; H01L 27/0924; H01L 21/1211; H01L 29/41791; H01L 29/66545; H01L 29/66795; H01L 29/785; H01L 29/6681; H01L 29/1054
USPC ........................................................ 438/157
See application file for complete search history.

(56) References Cited

U.S. PATENT DOCUMENTS

| 6,936,516 | B1 * | 8/2005 | Goo et al. ...................... 438/283 |
| 2009/0166741 | A1 * | 7/2009 | Pillarisetty et al. ........... 257/365 |
| 2009/0166742 | A1 * | 7/2009 | Pillarisetty et al. ........... 257/365 |
| 2009/0230478 | A1 * | 9/2009 | Pillarisetty et al. ........... 257/365 |
| 2011/0237046 | A1 * | 9/2011 | Maszara et al. ................ 438/424 |
| 2011/0291196 | A1 * | 12/2011 | Wei et al. ....................... 257/365 |
| 2012/0139007 | A1 * | 6/2012 | Tatsumura et al. ............ 257/192 |
| 2013/0168771 | A1 * | 7/2013 | Wu et al. ........................ 257/351 |
| 2013/0200468 | A1 * | 8/2013 | Cai et al. ........................ 257/401 |
| 2013/0249019 | A1 * | 9/2013 | Kelly et al. .................... 257/402 |
| 2013/0285141 | A1 * | 10/2013 | Kuo et al. ...................... 257/347 |

OTHER PUBLICATIONS

Oxford Dictionaries, "substantially", Apr. 2010, Oxford Dictionaries, definition/american_english/.*
Daewon Ha et al., "Molybdenum gate HfO2 CMOS FinFET technology", Dec. 13-15, 2004, Electron Devices Meeting, IEDM Technical Digest, IEEE International, pp. 643-646.*

(Continued)

*Primary Examiner* — Khiem D Nguyen
*Assistant Examiner* — Pauline Vu
(74) *Attorney, Agent, or Firm* — Ingrassia Fisher & Lorenz, P.C.

(57) ABSTRACT

A method is disclosed for fabricating an integrated circuit in a replacement-gate process flow utilizing a dummy-gate structure overlying a plurality of fin structures. The method includes removing the dummy-gate structure to form a first void space, depositing a shaper material to fill the first void space, removing a portion of the plurality of fin structures to form a second void space, epitaxially growing a high carrier mobility material to fill the second void space, removing the shaper material to form a third void space, and depositing a replacement metal gate material to fill the third void space.

12 Claims, 15 Drawing Sheets

(56) References Cited

OTHER PUBLICATIONS

Kavalieros, J. et al., "Tri-Gate Transistor Architecture with High-k Gate Dielectrics, Metal Gates and Strain Engineering", Jun. 13-15, 2006, VLSI Technology, 2006. Digest of Technical Papers. 2006 Symposium on, pp. 50-51.*

C.R. Manoj et al., "Impact of High-k Gate Dielectrics on the Device and Circuit Performance of Nanoscale FinFETs", Apr. 2007, IEEE Elec. Dev. Let., vol. 28, No. 4, pp. 295-297.*

* cited by examiner

REPLACEMENT GATE FINFET STRUCTURES WITH HIGH MOBILITY CHANNEL

TECHNICAL FIELD

The present disclosure generally relates to semiconductor devices and methods for fabricating semiconductor devices, and more particularly the present disclosure relates to FinFET structures and methods for fabricating the FinFET structures utilizing a replacement gate process flow.

BACKGROUND

In contrast to traditional planar metal-oxide-semiconductor field-effect transistors (MOS transistors or MOSFETs), which are fabricated using conventional lithographic fabrication methods, nonplanar MOSFETs incorporate various vertical transistor structures. One such semiconductor structure is the "FinFET," which takes its name from the multiple thin silicon "fins" that are used to form the respective gate channels, and which are typically on the order of tens of nanometers in width.

The prior art is replete with different techniques and processes for fabricating MOS transistor semiconductor devices, including both planar and non-planar devices. In accordance with typical fabrication techniques, a MOS transistor integrated circuit is formed by creating a device structure on a semiconductor substrate, where the device structure includes a gate stack formed on a layer of semiconductor material, and source and drain regions formed in the semiconductor material to define a channel region under the gate stack. Some integrated circuit devices are fabricated using a "replacement" gate technique; in accordance with this technique, temporary gate material (typically polycrystalline or amorphous silicon) is removed, temporarily forming a trench-like structure (hereinafter "trench"), and then replaced (filled) with a different "replacement" gate metal.

In recent years, a principal focus for improved MOS transistor performance has been increasing the mobility and drive current in the transistor. The demand for ever increasing performance and switching speed of integrated circuits requires continuously higher carrier mobility and drive currents. One approach to this problem is to introduce continuously higher channel stresses in order to achieve higher carrier mobility and drive currents. However, many stressors lose their effectiveness for three-dimensional device architectures, such as FinFET architectures. Another approach involves the use of a channel material with intrinsically higher carrier mobility than silicon including, for example, the various group III-V semiconductor alloys such as InP or GaAs, or group IV semiconductor materials such as Ge. However, a problem with using these "new" channel materials lies in the process integration into an existing silicon-compatible fabrication flow. That is, the handling of new substrate materials (compared to silicon) requires significant changes in processing (etching, cleaning, etc.), which is typically prohibitively expensive for use in large-scale fabrication operations.

Accordingly, it is desirable to provide FinFET structures and methods for fabricating FinFET structures with improved carrier mobility and drive current. It is further desirable to provide methods for fabricating such FinFET structures that do not have significant fabrication cost increases over those currently employed in the art. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

FinFET structures and methods for fabricating FinFET structures are provided herein. In accordance with an exemplary embodiment, a method is disclosed for fabricating an integrated circuit in a replacement-gate process flow utilizing a dummy-gate structure overlying a plurality of fin structures. The method includes removing the dummy-gate structure to form a first void space, depositing a shaper material to fill the first void space, removing a portion of the plurality of fin structures to form a second void space, epitaxially growing a high carrier mobility material to fill the second void space, removing the shaper material to form a third void space, and depositing a replacement metal gate material to fill the third void space.

In accordance with another exemplary embodiment, a FinFET integrated circuit is disclosed, which includes a plurality of fin structures overlying a semiconductor substrate comprising a silicon material, wherein a first portion of each of the plurality of fin structures include the silicon material and wherein a second portion of each of the plurality of fin structures include a high carrier mobility material, and a gate structure overlying the second portion of each of the plurality of fin structures.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
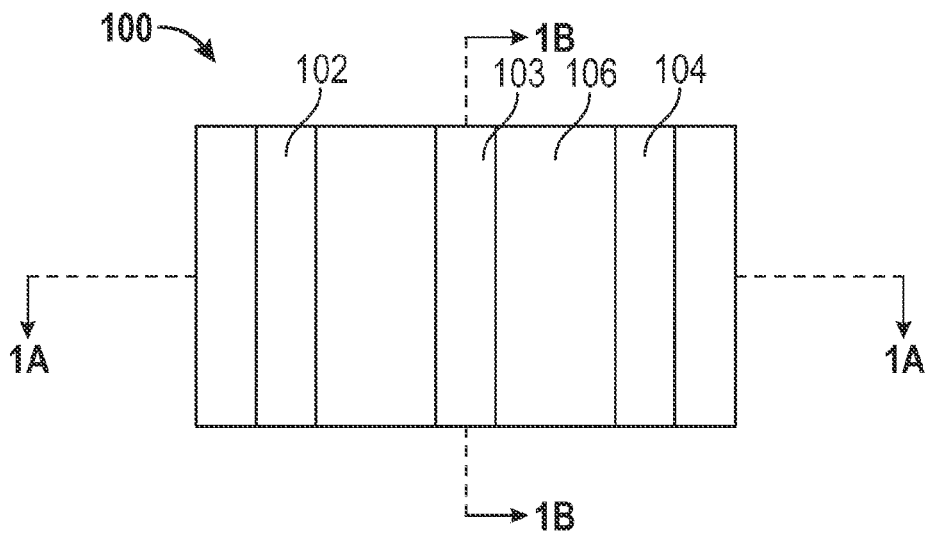
FIGS. 1-14 are cross-sectional and top views of FinFET structures illustrating methods for fabricating a FinFET structure with improved carrier mobility and drive current in accordance with embodiments of the present disclosure.
Figure 1A:
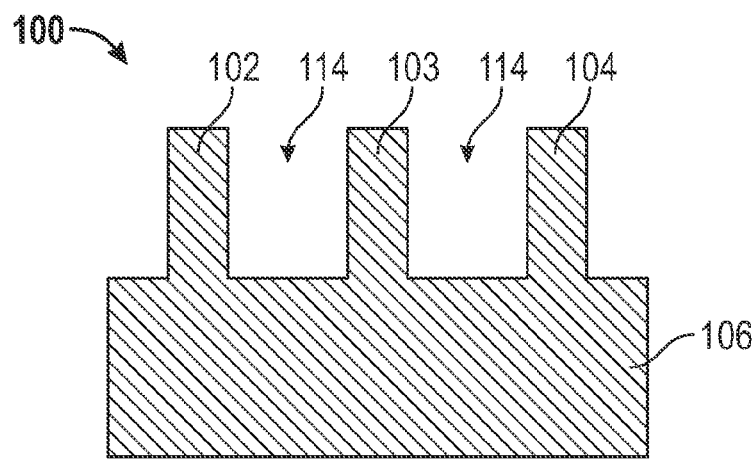
Figure 1B:
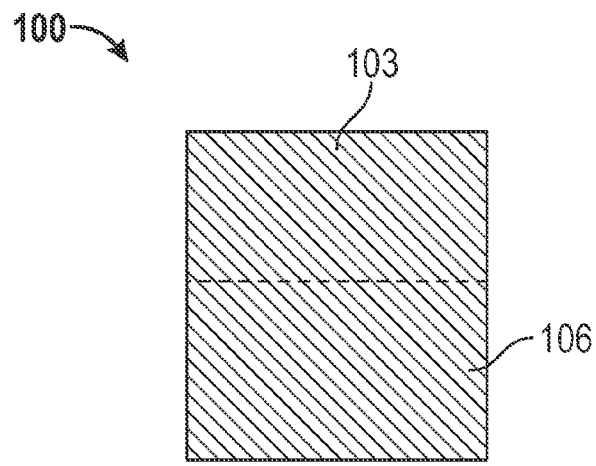

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based integrated circuits are well known and so, in the interest of brevity, many conventional steps will only be mentioned briefly herein or will be omitted entirely without providing the well-known process details.

Techniques and technologies described herein may be utilized to fabricate MOS transistor devices, including NMOS transistor devices, PMOS transistor devices, and NMOS/PMOS device combinations referred to as CMOS devices. Although the term "MOS device" properly refers to a device having a metal gate electrode and an oxide gate insulator, that term will be used throughout to refer to any semiconductor device that includes a conductive gate electrode (whether metal or other conductive material) that is positioned over or around a gate insulator (whether oxide or other insulator) which, in turn, is positioned over a semiconductor region or regions, or around the same as in the case of FinFET devices. Various steps in the manufacture of MOS components and FinFETs are well known and so, in the interest of brevity, many conventional steps will only be mentioned briefly herein or will be omitted entirely without providing the well-known process details. As used here, the term "FinFET" refers both to finned devices where only the vertical walls of the fins are influenced by gate voltages (also known as "double gate" or "dual-gate" devices) and to finned devices where the fin top surface as well as the fin vertical walls are influenced by gate voltages (also known as "tri-gate" or "triple gate" devices).

The manufacturing process described here can be utilized to create finned semiconductor devices from a bulk semiconductor substrate or a semiconductor-on-insulator (SOI) substrate. For purposes of illustrating an exemplary embodiment, the following description focuses on a bulk semiconductor implementation (in a non-limiting context). An exemplary approach to FinFET formation on a bulk semiconductor substrate employs a fin etch followed by a trench filling step where the trenches (which are formed from the fin etch) are filled with a dielectric material that is subsequently planarized to the upper surfaces of the fin(s). Thereafter, recesses are formed in the planarized dielectric to reveal the desired fin height. Another exemplary approach is a "gate last" or "replacement" gate approach, which is employed in the embodiments described below. For a gate-last approach, a dummy gate stack is formed overlying the revealed fins, and sidewall spacers are formed on the dummy gate stack. Anisotropic etching steps are performed during the fabrication of the dummy gate stack and sidewall spacers. Accordingly, the presently described fabrication process is intended to be integrated into existing process flows that utilize a typical gate-last approach.

FIGS. 1-14 are various cross-sectional and top views that illustrate a finned semiconductor device structure in connection with an exemplary process for fabricating it. This fabrication process represents one implementation of a method that is suitable for use in manufacturing finned semiconductor devices, such as FinFETs. An embodiment of this fabrication process begins by providing an appropriate substrate that is formed from or otherwise includes a semiconductor material. Preferred embodiments begin with an appropriate bulk substrate of semiconductor material, i.e., a bulk semiconductor substrate. In other embodiments, the substrate is realized as an SOI substrate that includes a support layer, a layer of insulation material overlying or residing on the support layer, and a layer of semiconductor material overlying or residing on the layer of insulation material. The semiconductor material is preferably a silicon material as typically used in the semiconductor industry, e.g., relatively pure silicon as well as silicon admixed with other elements such as germanium, carbon, and the like. The semiconductor material need not be doped, although it may be very lightly doped as either N-type or P-type, without impacting the manufacturing process described here. For example, bulk silicon substrates are often provided as lightly doped P-type substrates, and a lightly doped P-type semiconductor material could be used for the embodiment described here. Of course, the semiconductor material can be subsequently doped in an appropriate manner to form active regions in a manner that is well understood by those familiar with semiconductor manufacturing techniques.

FIG. 1 is a cross-sectional view of a semiconductor device structure 100 after semiconductor fin structures 102, 103, and 104 have been formed from a layer of semiconductor material 106. FIG. 1, and the subsequent figures, present three views of the semiconductor device structure 100 in various stages of the manufacturing process described herein. A first view is presented from above the semiconductor device. A second view is presented as a cross-sectional view from the perspective of an intersecting plane that is perpendicular to the longitudinal axes of the semiconductor fin structures 102, 103, 104 (cross-section "A-A"). A third view is presented as a cross-sectional view from the perspective of an intersecting plane through semiconductor fin 103 (cross-section "B-B"). As such, when a figure is referred to by number herein, it is intended that all three views be referenced.

For this exemplary embodiment, the layer of semiconductor material 106 was initially provided in the form of a bulk semiconductor substrate. Although any number of fin structures could be created, FIG. 1 depicts an exemplary fin arrangement that includes three semiconductor fin structures 102, 103, and 104. The semiconductor fin structures 102, 103, and 104 can be formed from the layer of semiconductor material 106 using any number of known process steps and techniques. One such method employs photolithography techniques to form a patterned etch mask overlying the layer of semiconductor material 106, typically a patterned hard mask. Thereafter, the semiconductor material 106 is anisotropically etched using the patterned etch mask to define the semiconductor fin structures 102, 103, and 104. If the desired fin thickness is too thin for creation by lithography directly, then known methods for creating spacers can be applied in such a manner that spacers composed of nitride or other etch-resistant material become the pattern and hard mask for fin creation. In accordance with certain embodiments, the hard mask material remains on the underlying semiconductor material 106. In this regard, each semiconductor fin structure 102, 103, and 104 in FIG. 1 includes a fin formed from the layer of semiconductor material 106, and a hard mask cap (not specifically illustrated) overlying the fin. In some embodiments, however, the hard mask caps are removed from the fins after etching the semiconductor material 106 to form the semiconductor fin structures 102, 103, and 104, or their use is avoided entirely.

When creating the fins, the layer of semiconductor material 106 may also be etched in an appropriate manner to create isolation trenches 114 in the bulk semiconductor substrate 106, as best illustrated in cross-section "A" of FIG. 1. Although not shown in FIG. 1, the left side of the leftmost isolation trench 114 can be defined with a sidewall of the semiconductor material 106 (and the right side of the rightmost isolation trench 114 can be similarly defined). As is well understood, the isolation trenches 114 are created to accommodate isolation material for purposes of insulating the semiconductor fin structures 102, 103, and 104 from one another.

Accordingly, the isolation trenches 114 are located between and adjacent to the semiconductor fin structures 102, 103, and 104.

For ease of illustration and clarity, FIG. 1 shows an embodiment where the isolation trenches 114 are formed at a single and consistent depth. In practice, however, dual-depth or multiple-depth isolation trenches could be fabricated if desired. In this regard, a multiple-depth approach may be considered when forming relatively high aspect ratio trenches. For example, a dual-depth approach could be used to form a relatively shallow isolation trench between the three semiconductor fin structures 102, 103, and 104, and to form relatively deep isolation trenches outboard the three semiconductor fin structures 102, 103, and 104. The remaining manufacturing process steps described below can be performed (with appropriate modification if needed) to accommodate single-depth, dual-depth, or multiple-depth isolation trenches.

As mentioned above, the disclosed semiconductor device fabrication process could be used to create finned devices on an SOI substrate (rather than a bulk substrate). In such embodiments, the process may begin by providing an SOI substrate having a layer of semiconductor material overlying an insulator layer. Using conventional techniques, the layer of semiconductor material is etched to define one or more semiconductor fin structures overlying the insulator layer. In contrast to the bulk implementation described above, formation of fins from an SOI substrate inherently results in the creation of isolation between the fins due to the presence of isolating buried oxide. Nonetheless, the techniques and methodologies described below can still be used to process a semiconductor device structure having fins etched from an SOI substrate.

Figure 2:
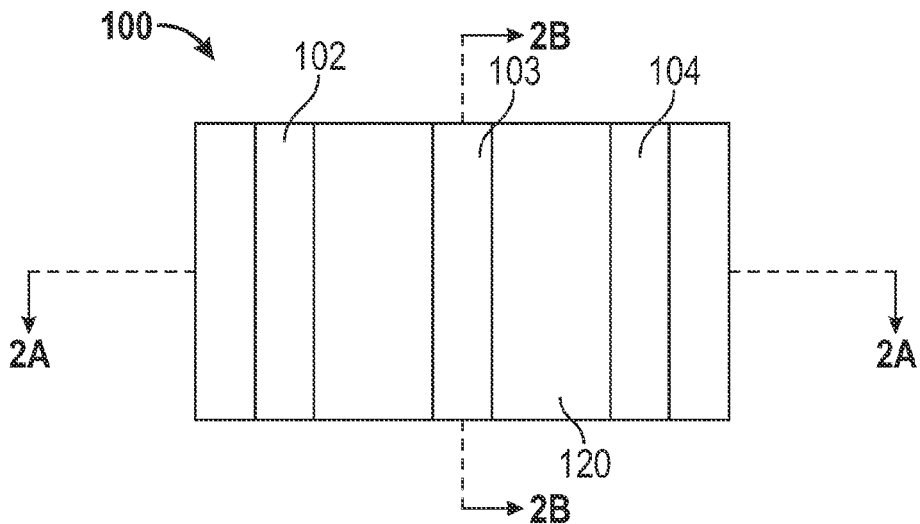
Figure 2A:
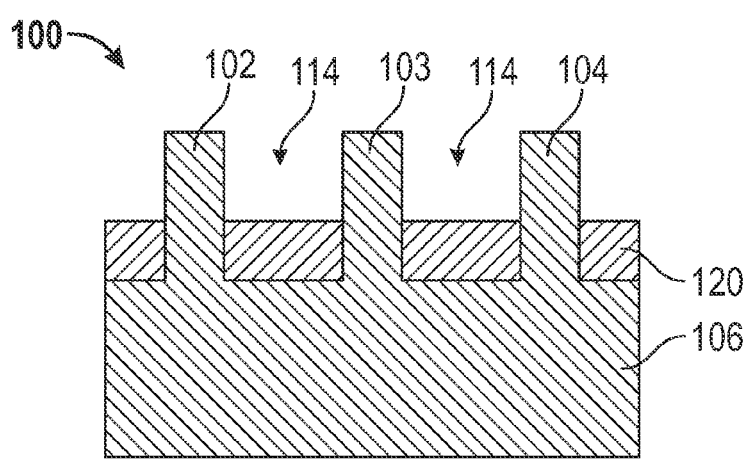
Figure 2B:
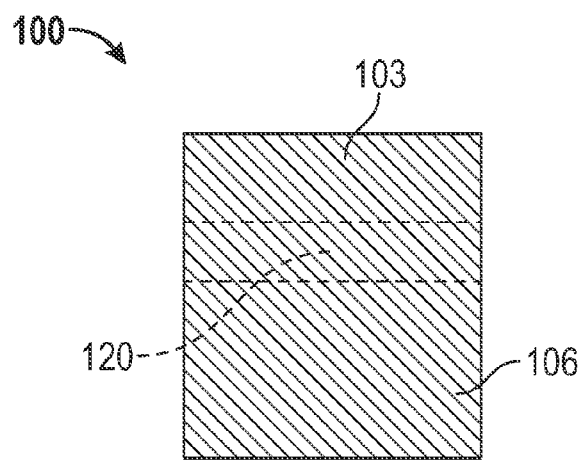

This embodiment of the manufacturing process continues, with reference to FIG. 2, by filling the isolation trenches 114 with an insulating material 120. At this point in the fabrication process, the isolation trenches 114 have been completely filled and overfilled with the insulating material 120 (for example, by deposition), and subsequently the insulating material 120 has been polished or otherwise planarized to create a flat surface from the deposited insulating material 120, and further etched below the height of the fins 102, 103, and 104.

In certain embodiments, the insulating material 120 is an oxide material that is blanket deposited overlying the semiconductor fin structures 102, 103, and 104 using a well-known material deposition technique such as chemical vapor deposition (CVD), low pressure chemical vapor deposition (LPCVD), or plasma enhanced chemical vapor deposition (PECVD). The insulating material 120 is deposited such that it fills the space adjacent to and between the semiconductor fin structures 102, 103, and 104 (i.e., the isolation trenches 114 in this example). Thereafter, a flat surface is temporarily created from the deposited insulating material 120. In particular embodiments, the deposited insulating material 120 is planarized using, for example, a chemical mechanical polishing tool. Consequently, the resulting temporary flat surface corresponds to both the exposed surface of the polished insulating material 120 and the exposed upper surfaces of the fins 102, 103, and 104. Subsequently, the insulating material 120 is etched using, for example, anisotropic etching techniques to re-form the trenches 114 at a shallower depth, due to the presence of the insulating material 120. Material 120 is shown in dashed lines in cross-section B-B because the insulating material is positioned in front of the cross section through fin 103 and illustrates that a portion of the fin extends above material 120.

Figure 3:
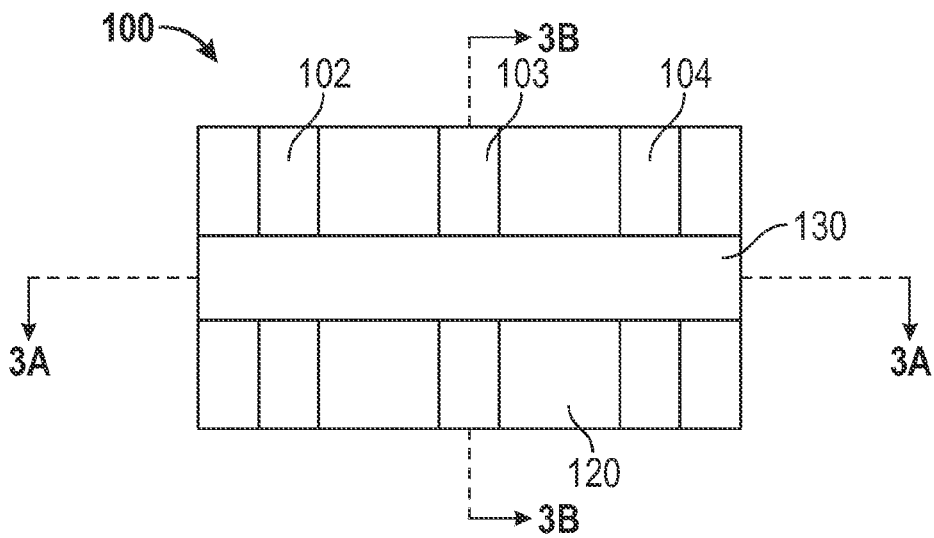
Figure 3A:
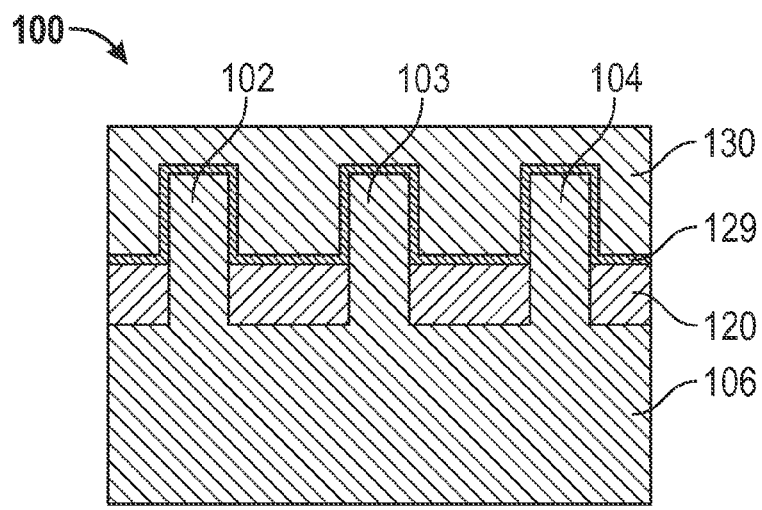
Figure 3B:
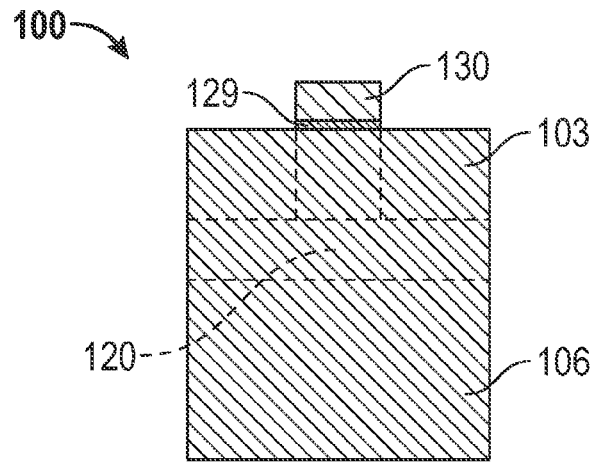

FIG. 3 illustrates a replacement gate procedure to form a gate structure transversely overlying the semiconductor fin structures 102, 103, and 104. As shown in FIG. 3, a gate dielectric layer 129, which can include, for example, an oxide such as a silicon oxide, is deposited followed by a dummy gate structure 130, both of which are fabricated such that they transversely overlie the semiconductor fin structures 102, 103, and 104. For this example, the gate dielectric layer 129 and the dummy gate structure 130 are orthogonally oriented relative to the longitudinal axes of the semiconductor fin structures 102, 103, and 104.

The dummy gate structure 130 can be fabricated using conventional process steps such as material deposition, photolithography, and etching. In this regard, fabrication of the dummy gate structure 130 may begin by forming at least one layer of dummy gate material overlying the device 100. For this example, the material used for the dummy gate 130 is formed overlying the device. The dummy gate material is typically a polycrystalline silicon material. The dummy gate materials are blanket deposited on the semiconductor device structure in a conformal manner (using, for example, any of the deposition techniques mentioned previously). The dummy gate material is then isotropically etched into the desired topology that is defined by the dummy gate etch mask. The resulting dummy gate 130 is depicted in FIG. 3.

After the dummy gate structure 130 has been created, the process may continue by optionally forming spacers adjacent the sidewalls of the dummy gate structure 130. The spacers (not depicted) can be fabricated using conventional process steps such as material deposition, photolithography, and etching. In this regard, formation of the spacers may begin by conformally depositing a spacer material overlying the dummy gate structure 130. The spacer material is an appropriate insulator, such as silicon oxide or silicon nitride, and the spacer material can be deposited in a known manner by, for example, atomic layer deposition (ALD), CVD, LPCVD, semi-atmospheric chemical vapor deposition (SACVD), or PECVD. The spacer material is deposited to a thickness so that, after anisotropic etching, the spacers have a thickness that is appropriate for the subsequent etching steps described below. Thereafter, the spacer material is anisotropically and selectively etched to define the spacers. In practice, the spacer material can be etched by, for example, reactive ion etching (RIE) using a suitable etching chemistry. As noted above, formation of spacers is an optional step and may or may not be include in an embodiment process flow.

Figure 4:
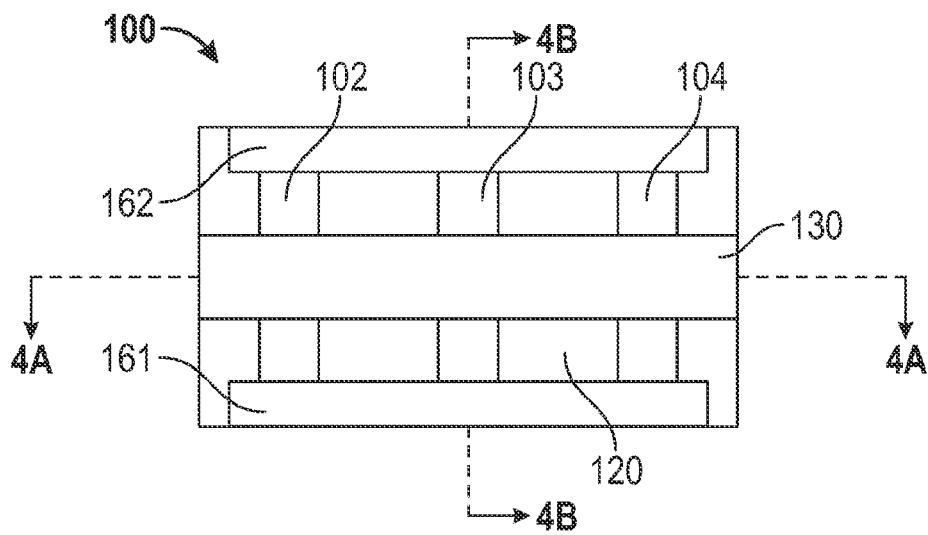
Figure 4A:
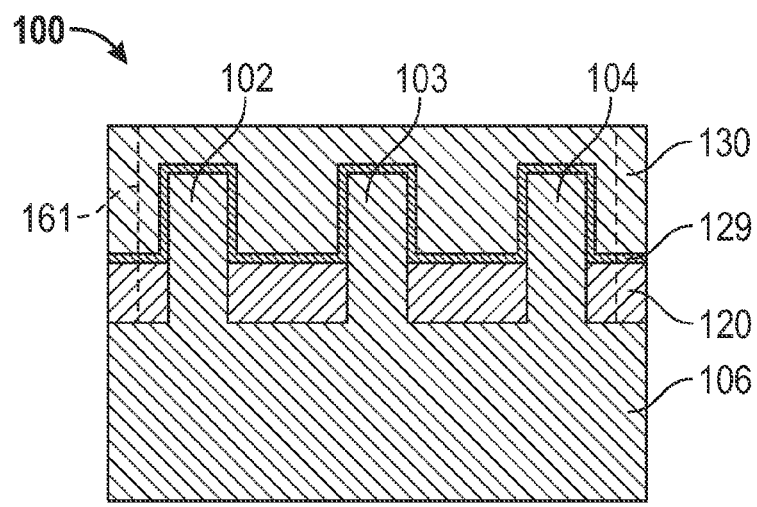
Figure 4B:
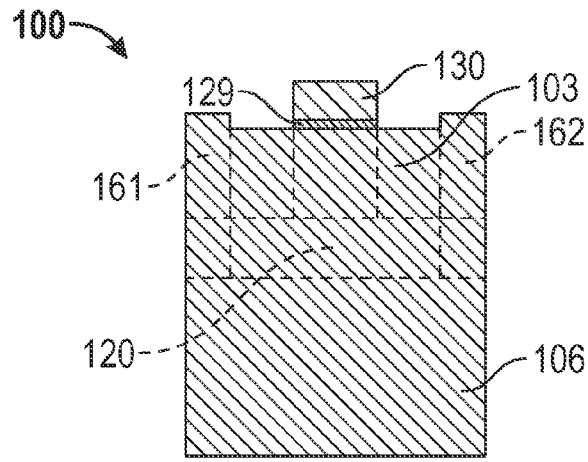

After the spacers have been created if desired, this exemplary process continues by forming source/drain regions 161/162 in the semiconductor device structure, as shown in FIG. 4. The source/drain regions 161/162 are formed by sequentially or concurrently etching the fins 102, 103, and 104 and the insulating material 120 to the desired depth. The manufacturing process may proceed by at least partially filling the source/drain regions 161/162 with semiconductor material. The semiconductor material may be a silicon material, a stress inducing semiconductor material, or the like. For an NMOS transistor device, the semiconductor material can include a material such as silicon carbon, or another material that has a lower lattice constant than silicon. In contrast, for a PMOS transistor device, the semiconductor material can include a material such as silicon germanium, or another material that has a higher lattice constant than silicon. As is well understood, such epitaxial growth occurs from the semiconductor material 106 present at the bottom of the source/drain regions 161/162. In certain embodiments, the semiconductor material may be an in situ doped material in that a suitable dopant is introduced into a host material as that host material is grown. Epitaxially grown in situ doped silicon material may be utilized here such that the material need not be subjected to ion implantation for purposes of doping. It should be appreciated that the use of the stress inducing semiconductor material is optional. As an alternative, the fins can be partially or fully exposed in the source/drain regions 161/162, and silicon (which is not stress inducing) can be epitaxially grown in the source/drain regions as desired. The epitaxially-grown silicon could also be in situ doped, in an embodiment. Thereafter, the semiconductor material in the source/drain regions 161/162 can be subjected to ion implantation (for source/drain doping) at this time if so desired.

Figure 5:
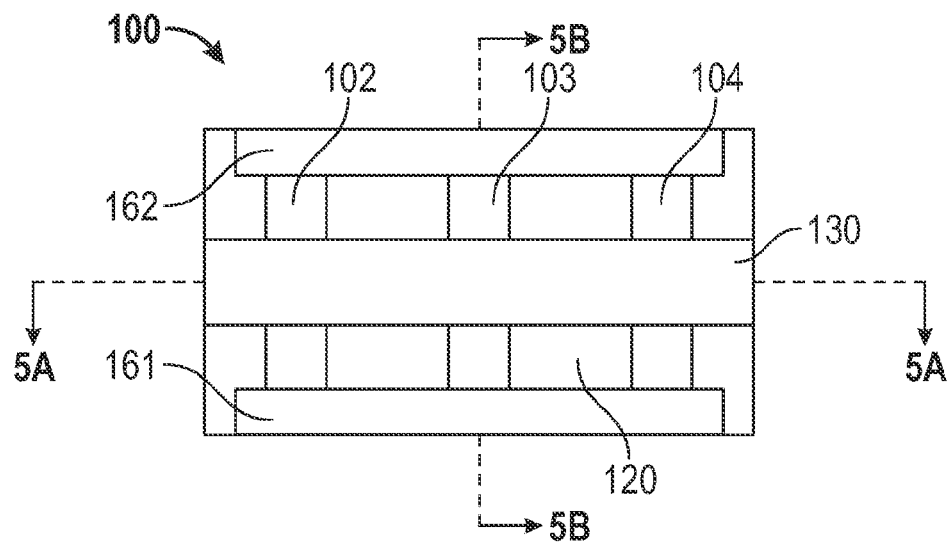
Figure 5A:
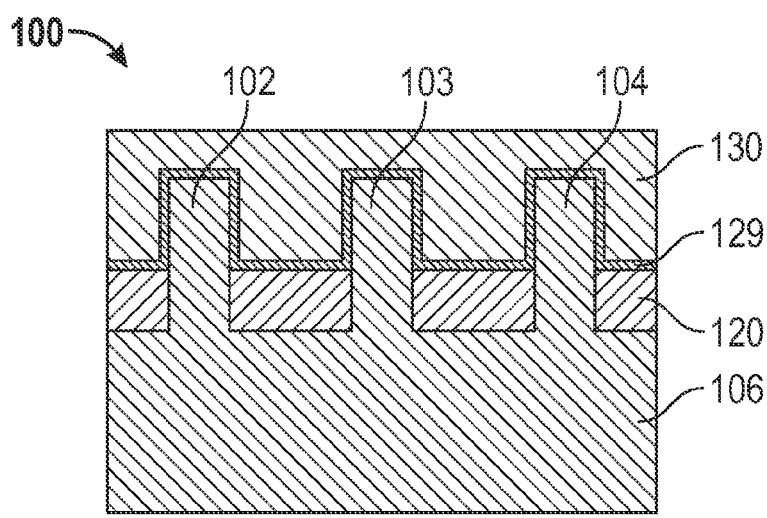
Figure 5B:
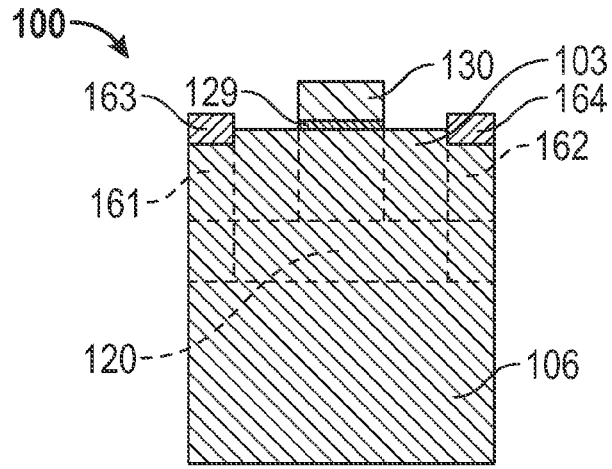
Figure 6:
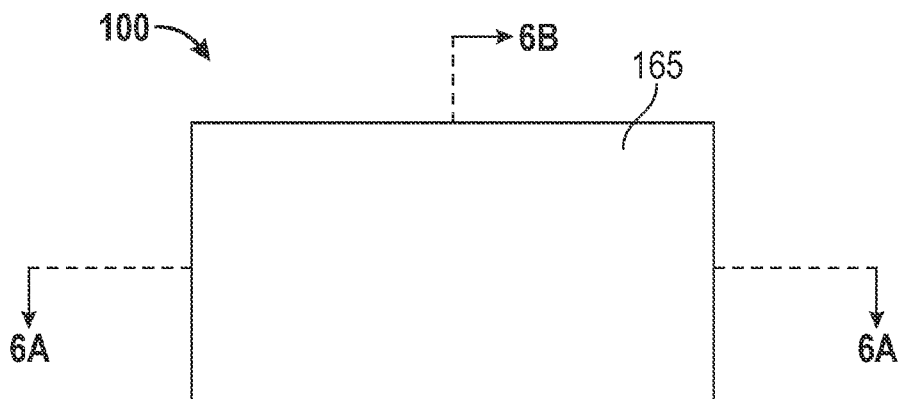
Figure 6A:
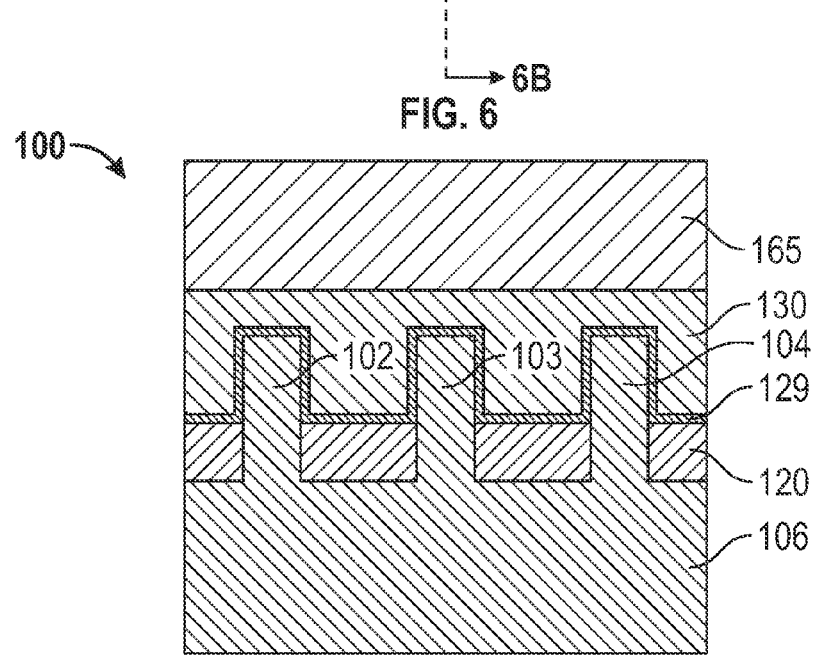
Figure 6B:
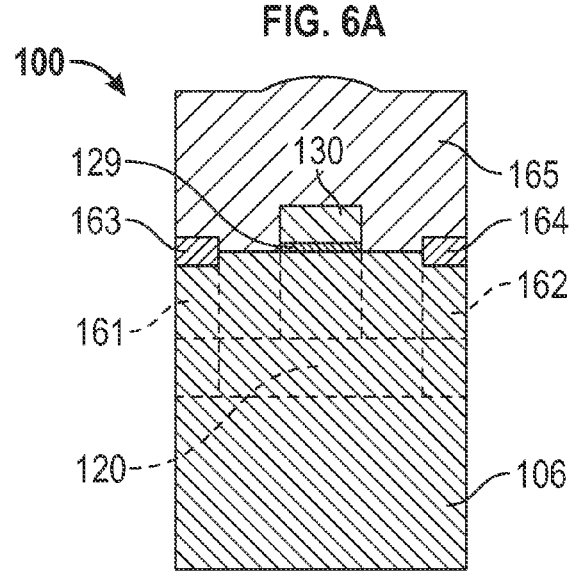
Figure 7:
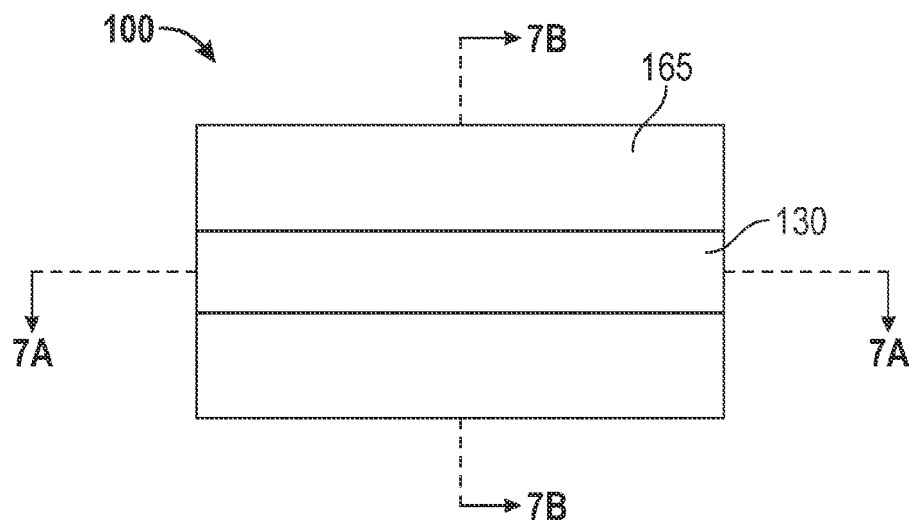
Figure 7A:
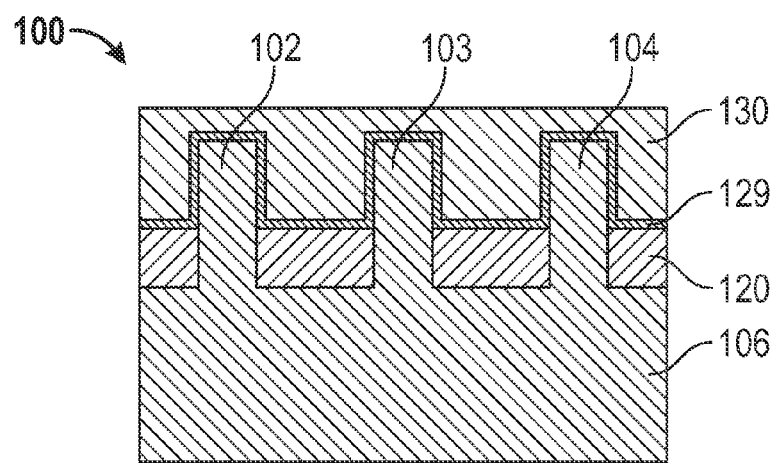
Figure 7B:
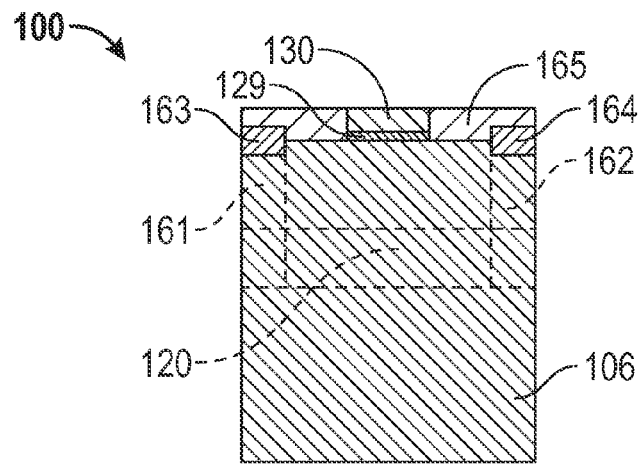
Figure 8:
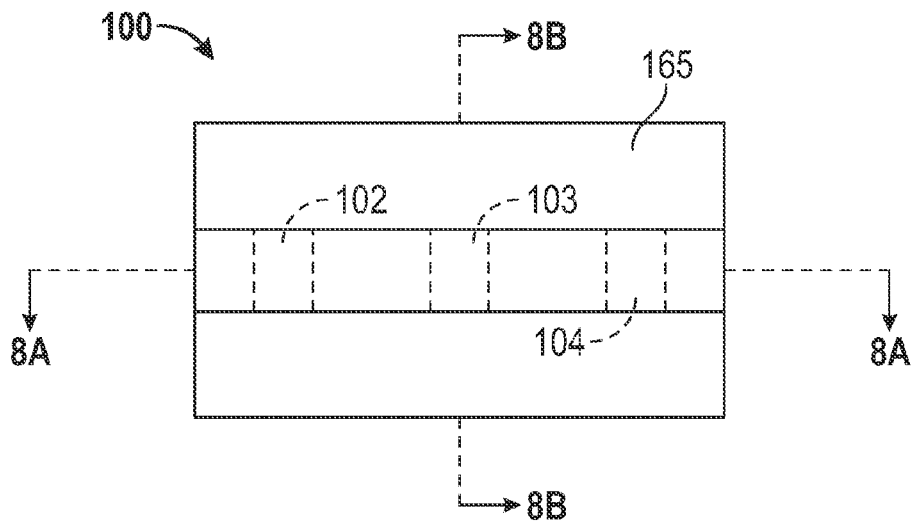
Figure 8A:
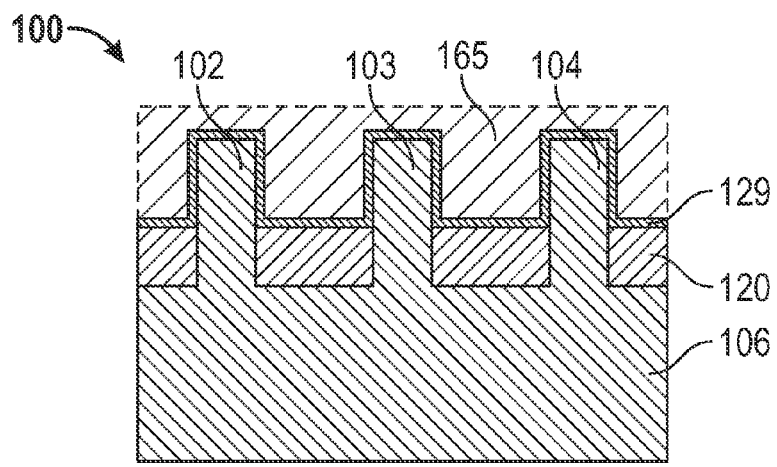
Figure 8B:
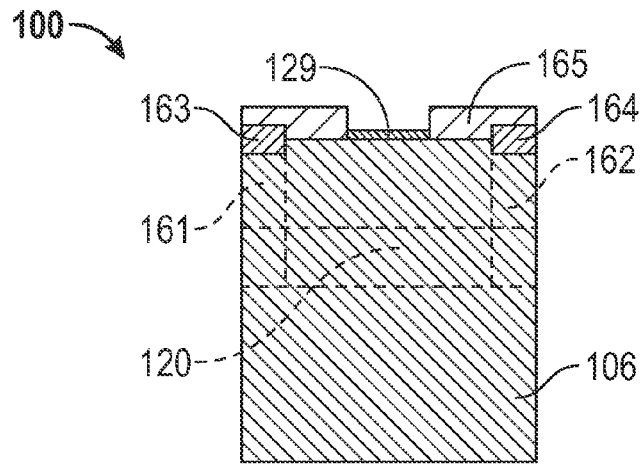
Figure 9:
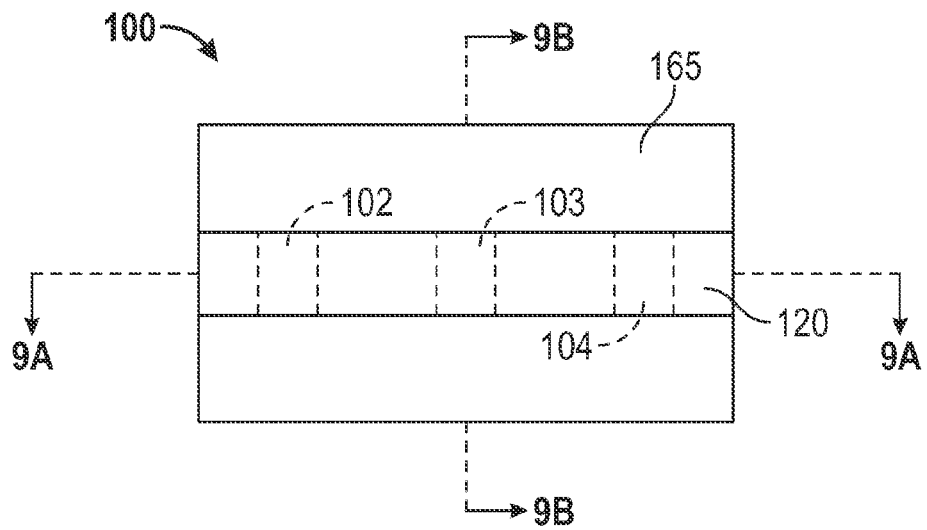
Figure 9A:
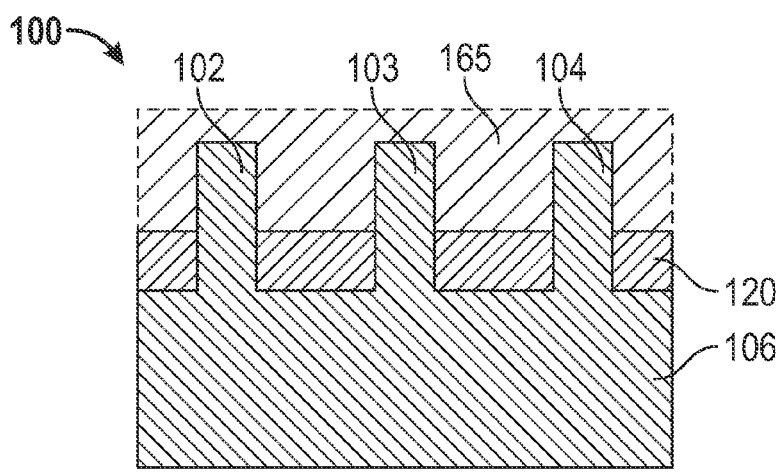
Figure 9B:
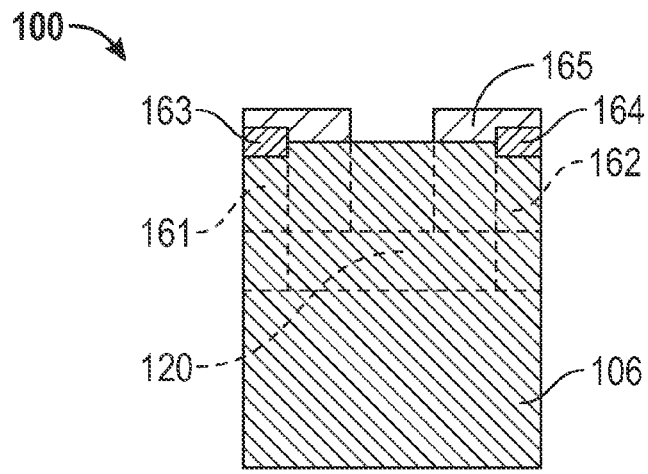

With reference now to FIG. 5, in accordance with one embodiment, the semiconductor material is subjected to a silicidation process to form the source/drain contact areas 163/164 at this time. Alternatively, silicidation could be performed later during the fabrication process. With reference now to FIGS. 6 and 7, the device 100 is covered with a thick layer 165 of oxide, such as a tetraethyl-orthosilicate (TEOS) material. Next, the oxide layer 165 is planarized by, for example, CMP until the dummy gate 130 is exposed. With reference now to FIGS. 8 and 9, the dummy gate 130 is removed using, for example, isotropic or anisotropic etching techniques. The gate dielectric layer 129 is also removed in the same etching step, or in a separate etching step.

Figure 10:
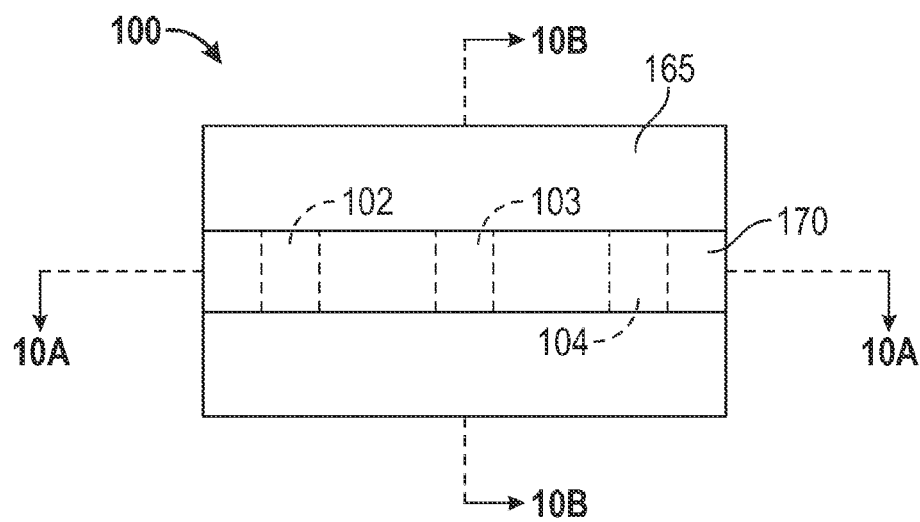
Figure 10A:
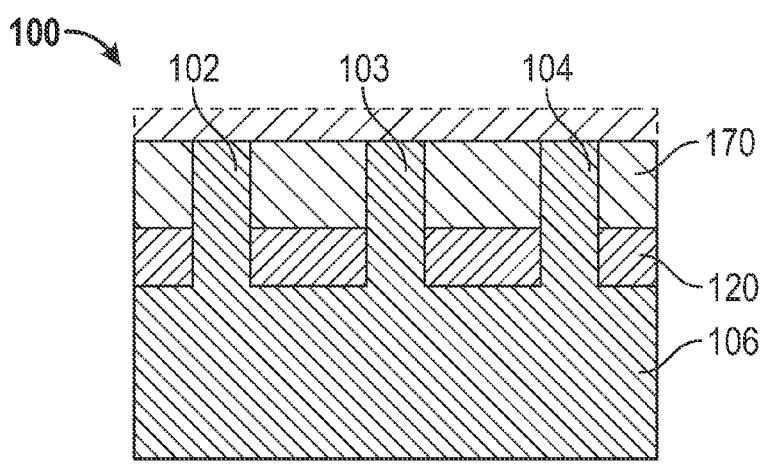
Figure 10B:
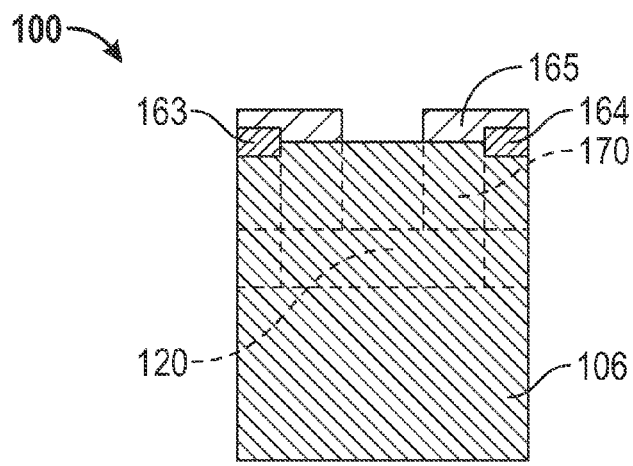

With reference now to FIG. 10, a "shaper" material 170 is deposited to fill out the empty space around the fin, i.e., the space formerly occupied by the gate dielectric and the dummy gate structure, in order to have an imprint of the fin shape. In one embodiment, the shaper material 170 is a nitride material, such as silicon nitride. Polishing and/or etching techniques are then applied to the shaper material 170 to expose the fins 102, 103, and 104, as shown in FIG. 10, such that the height of the shaper material is substantially equal to the height of the fins.

Figure 11:
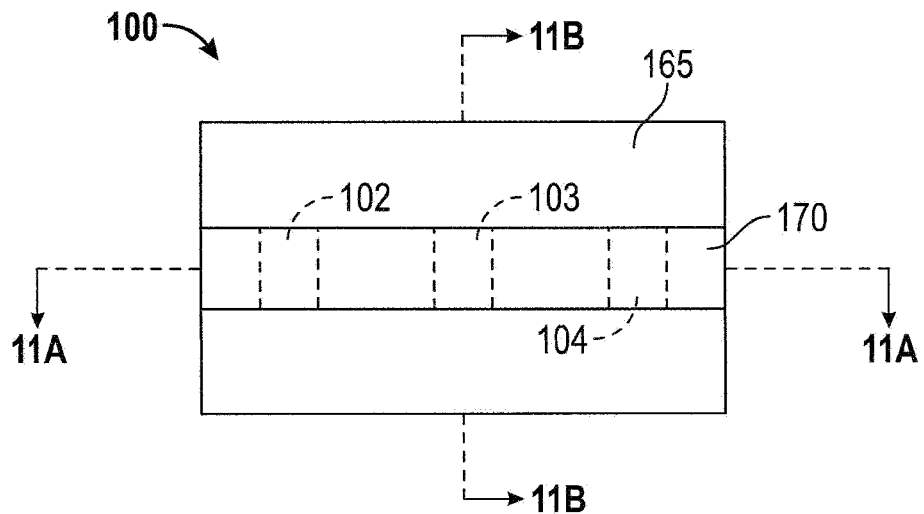
Figure 11A:
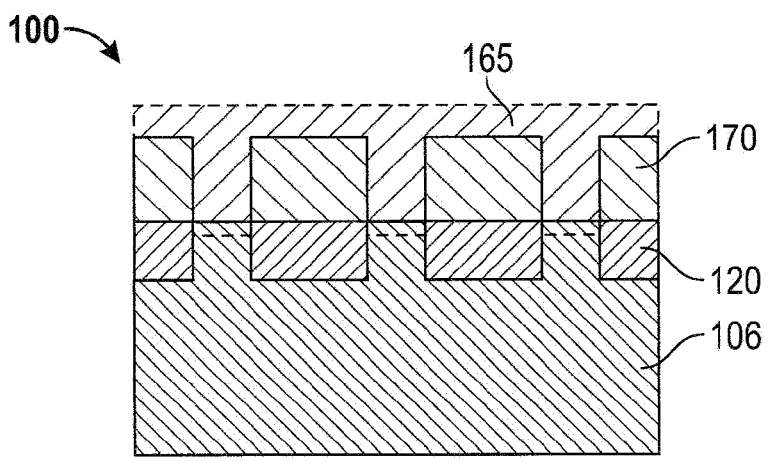
Figure 11B:
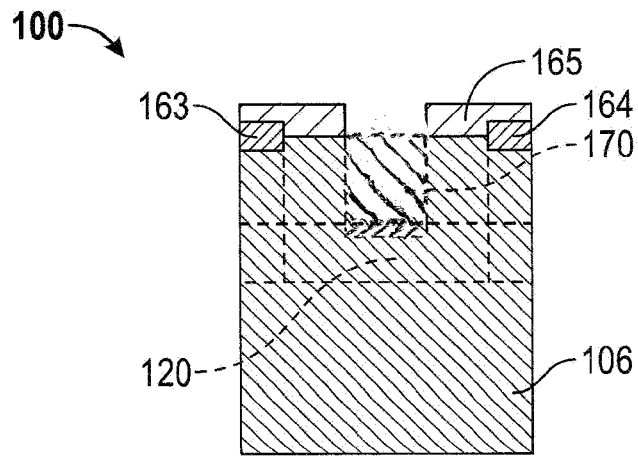
Figure 12:
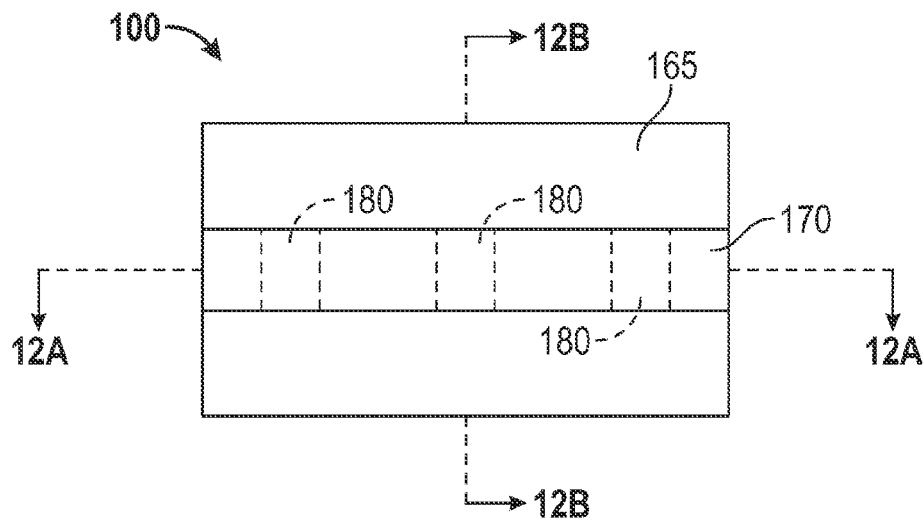
Figure 12A:
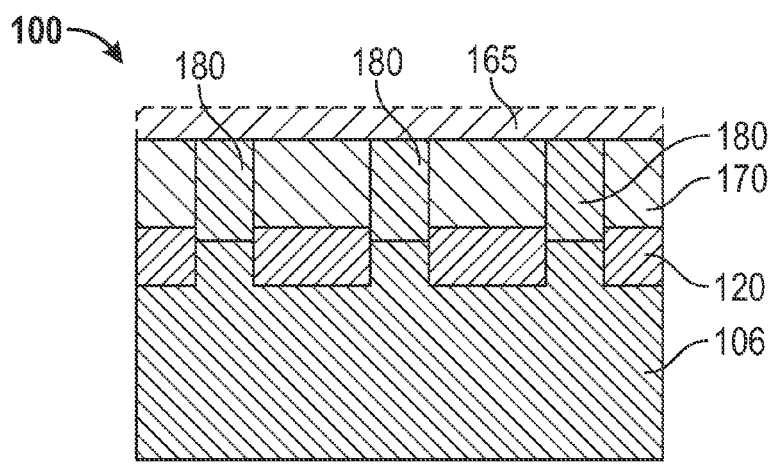
Figure 12B:
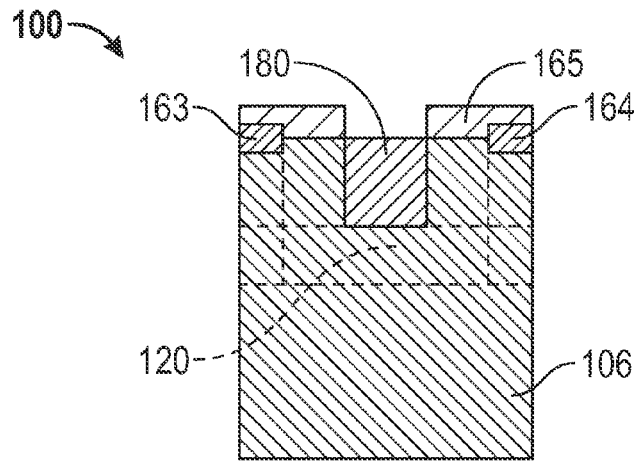

Thereafter, with reference to FIG. 11, the fins 102, 103, and 104 are etched back beyond the insulating material 120 in the area underneath the region formerly occupied by the dummy gate structure. As such, the fins are etched back in the area adjacent to the shaper material. Etching can be performed using anisotropic wet or dry etching techniques, as are known in the art. This step results in a vacant region along each fin between the source and the drain. This vacant region is formed as having substantially the same length longitudinally along the fin as the shaper material. Thereafter, with reference to FIG. 12, the vacant region of fins 102, 103, and 104 are selectively regrown with a crystalline high mobility channel material 180. Growth occurs to the height of the fin structure, such that the completed fin structures have a continuous height. The channel material 180 can be provided as a material with an intrinsically higher carrier mobility than silicon including, for example, the various group III-V semiconductor alloys such as InP or GaAs, or group IV semiconductor materials such as Ge. As will be appreciated, the group III-V alloys will be suitable for use in fabricating NFET devices, whereas the group IV materials will be suitable for use in fabricating PFET devices. Further, the newly grown channel material 180 can be in situ doped in order to adjust the threshold voltage. In situ doping techniques are well-known in the art, and need not be explicated in great detail herein.

Figure 13:
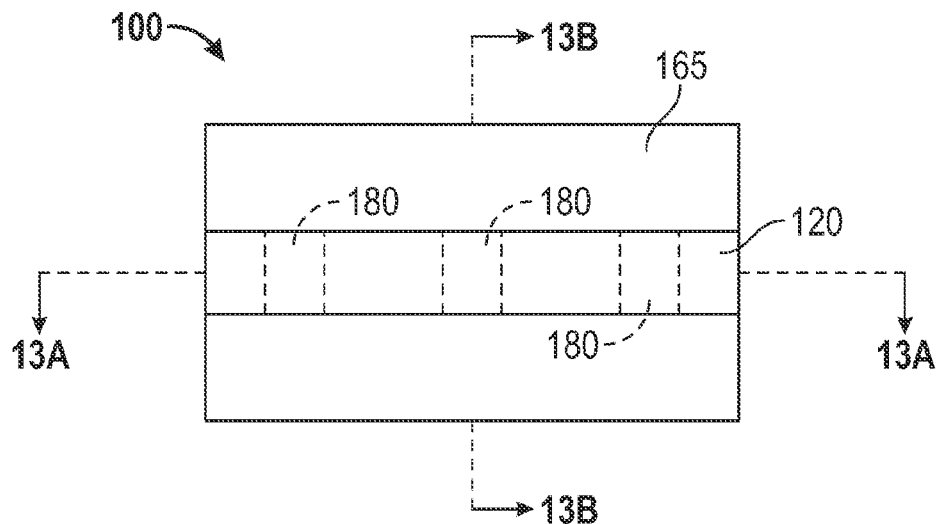
Figure 13A:
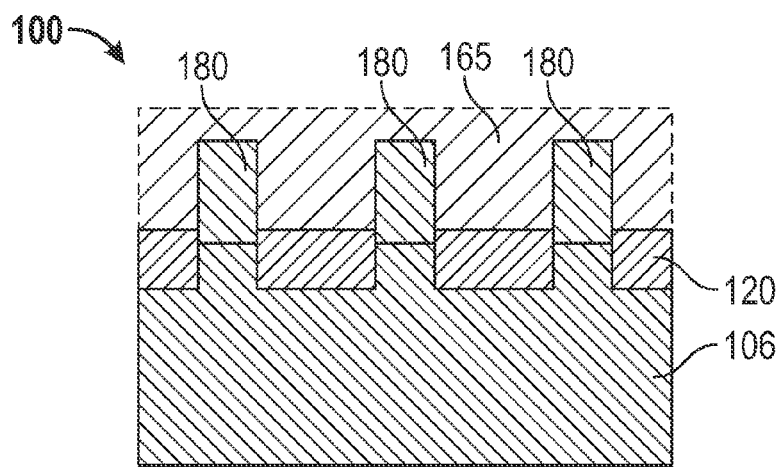
Figure 13B:
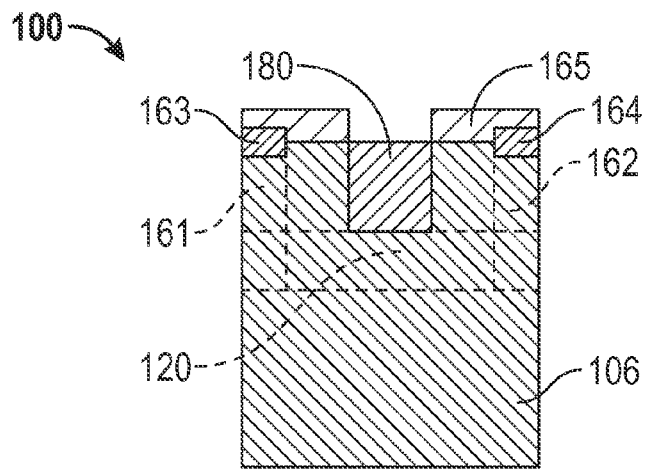
Figure 14:
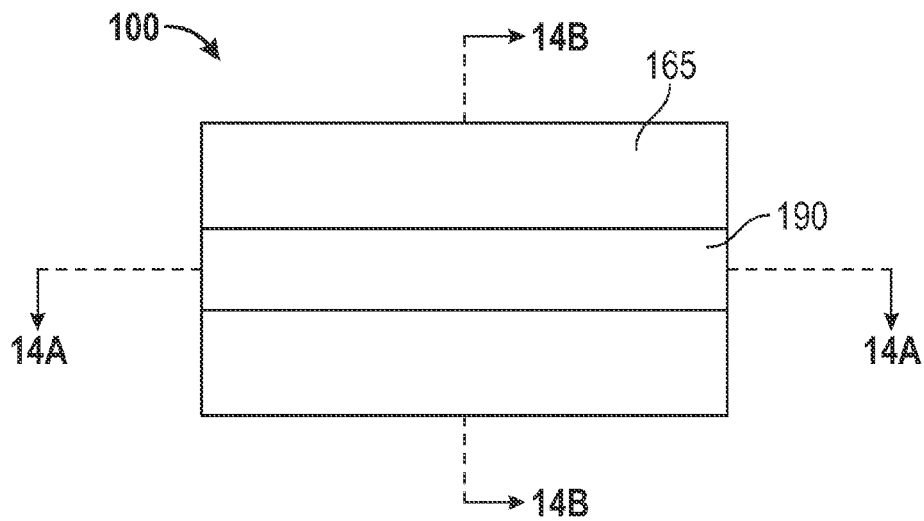
Figure 14A:
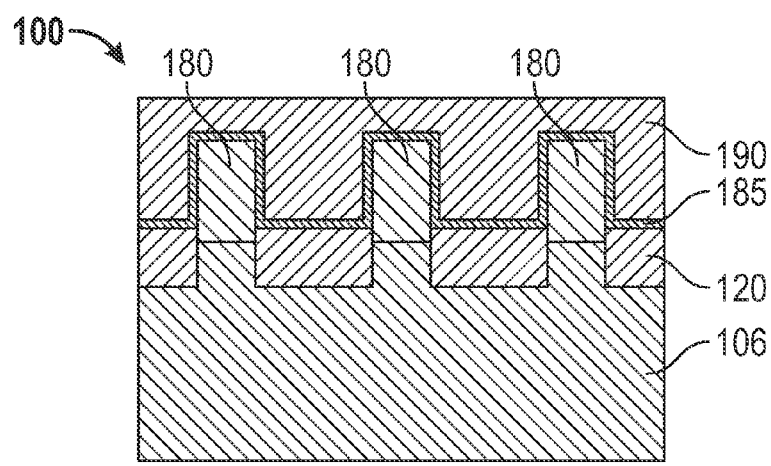
Figure 13B:
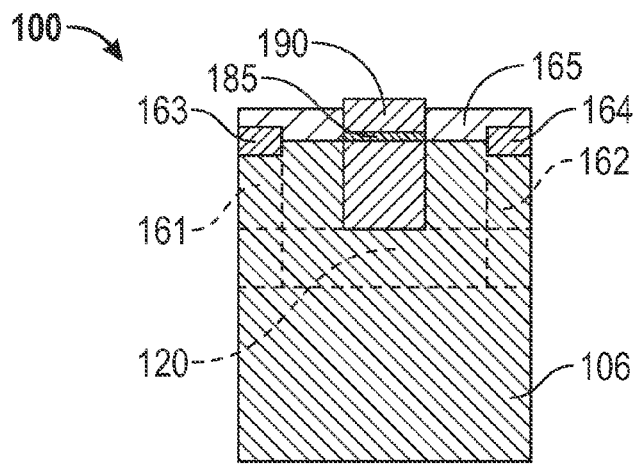

With reference now to FIGS. 13 and 14, the shaper material 170 is removed, for example by isotropic or anisotropic wet or dry etching. Further, a high-k dielectric material 185 and a metal-gate material 190 is deposited into the open gate structures, in the area formerly occupied by the shaper material 170, and over the fins 102, 103, 104. The metal-gate material is selected depending on the workfunction requirement of the gate structure. For example, in the case of an NFET, a low workfunction metal such as W may be used. Alternatively, a high workfunction metal such as nickel may be used for the fabrication of a PFET device. The selection of replacement gate metals based on their workfunction values is well within the level of skill of a person having ordinary skill in the art. To finish the gate structures, the gate structures may be patterned and/or polished using conventional techniques.

Thereafter, further processing steps can be performed to fabricate the device 100, as are well-known in the art. For example, further steps (not shown) conventionally include, for example, the formation of contacts and the formation of one or more patterned conductive layer across the device with dielectric layers therebetween, among many others. The subject matter disclosed herein is not intended to exclude any subsequent processing steps to form and test the completed device 100 as are known in the art.

Figure 15:
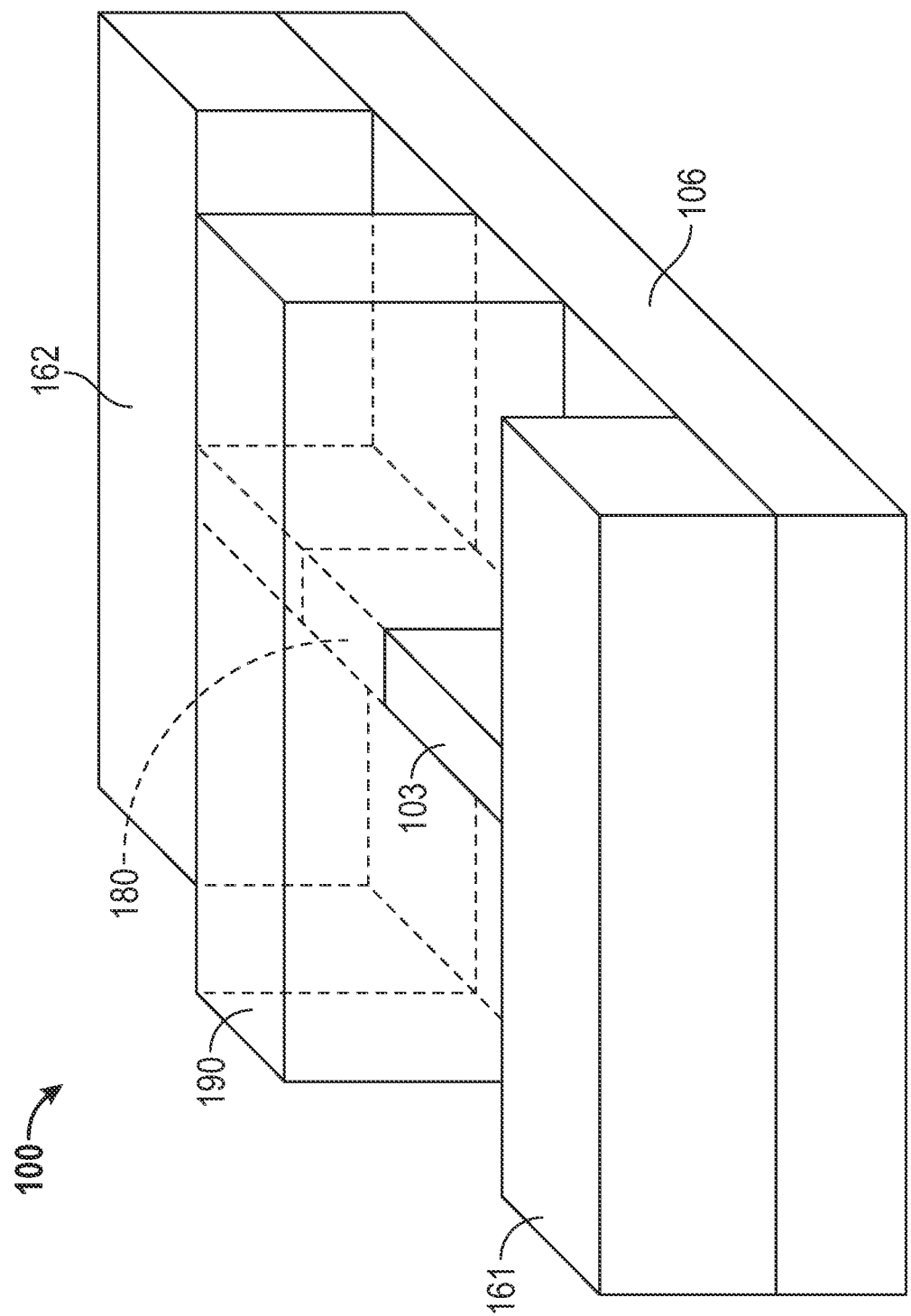
FIG. 15 is a perspective view of a FinFET structure fabricated in accordance with the methods illustrated in FIGS. 1-14.

FIG. 15 depicts a perspective view of a device 100 with a single fin (i.e., fin 103) that has been fabricated in accordance with the previously described processing steps. As shown therein, a substrate 106 has a source/drain 161/162 formed thereabove. In between the source/drain 161/162 is the fin structure 103. Overlying the fin structure 103 is the gate structure 190. The portion of the fin 103 underlying the gate structure 190 has been replaced with a material 180 having an intrinsically higher carrier mobility than silicon. Accordingly, FinFET structures and methods for fabricating FinFET structures on a semiconductor device have been described. By using group III-V alloys or group IV metals in the channel region only, the FinFET structures exhibit improved carrier mobility and drive current. Further, significant fabrication cost increases are avoided by using conventional silicon material substrates and conventional processing techniques.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating an integrated circuit in a replacement-gate process flow utilizing a dummy-gate structure overlying a plurality of fin structures, comprising:
   removing the dummy-gate structure to form a first void space, the first void space being between the plurality of fin structures but not over the plurality of fin structures;
   depositing a shaper material to fill the first void space and removing any excess shaper material from over the plurality of fin structures such that a height of the shaper material is equal to a height of the plurality of fin structures, wherein the depositing the shaper material comprises depositing the shaper material directly adjacent to and in contact with sidewalls of the plurality of fin structures;
   removing a portion of the plurality of fin structures to form a second void space;
   epitaxially growing a high carrier mobility material to fill the second void space;

removing the shaper material to form a third void space; and depositing a replacement metal gate material to fill the third void space.

2. The method of claim 1, wherein the first void space is formed between the plurality of fin structures.

3. The method of claim 1, wherein the depositing the shaper material comprises depositing a silicon nitride material.

4. The method of claim 1, wherein, after the removing the portion of the plurality of fin structures to form the second void space, a longitudinal length of the first and second void spaces along the plurality of fin structures is equal.

5. The method of claim 1, wherein the epitaxially growing the high carrier mobility material comprises growing a group III-V material or a group IV material.

6. The method of claim 5, wherein the epitaxially growing the high carrier mobility material comprises growing a InP, GaAs, or a Ge material.

7. The method of claim 1, wherein the epitaxially growing the high carrier mobility material is performed such that the high carrier mobility material fills the second void space to the height of the plurality of fin structures, thereby forming a fin structure with a continuous height.

8. The method of claim 1, wherein the third void space is formed so as to correspond in size and shape to the first void space.

9. The method of claim 1, further comprising depositing a high-k dielectric material in the third void space prior to the depositing the replacement metal gate material.

10. The method of claim 1, wherein the replacement metal gate material is further deposited so as to overlie the plurality of fin structures.

11. A method for fabricating an integrated circuit in a replacement-gate process flow utilizing a dummy-gate structure overlying a plurality of fin structures having a first carrier mobility, comprising:

removing the dummy-gate structure to form a first void space;

depositing a shaper material to fill the first void space and removing any excess shaper material from over the plurality of fin structures such that a height of the shaper material is equal to a height of the plurality of fin structures, wherein the depositing the shaper material comprises depositing the shaper material directly adjacent to and in contact with sidewalls of the plurality of fin structures;

removing a portion of the plurality of fin structures having the first carrier mobility to form a second void space;

epitaxially growing a high carrier mobility material that has a second carrier mobility, the second carrier mobility having a mobility that is greater than the first carrier mobility, to fill the second void space;

removing the shaper material to form a third void space; and depositing a replacement metal gate material to fill the third void space.

12. A method for fabricating an integrated circuit in a replacement-gate process flow utilizing a dummy-gate structure overlying a plurality of fin structures, comprising:

removing the dummy-gate structure to form a first void space, the first void space being between the plurality of fin structures but not over the plurality of fin structures;

depositing a shaper material to fill the first void space without covering the plurality of fin structures, wherein the depositing is performed in a two-step process that consists of two steps a) and b) performed in immediate sequence, b) directly after a):

a) depositing the shaper material directly adjacent to and in contact with sidewalls of the plurality of fin structures and filling an entirety of the first void space; and b) immediately subsequent to the depositing the shaper material, removing any excess shaper material from over the plurality of fin structures such that a height of the shaper material is equal to a height of the plurality of fin structures;

immediately subsequent to said depositing the shaper to fill the first void space without covering the plurality of fin structures, removing a portion of each of the plurality of fin structures to form a second void space;

epitaxially growing a high carrier mobility material to fill the second void space;

subsequent to said epitaxially growing the high carrier mobility material, removing the shaper material to form a third void space; and depositing a replacement metal gate material to fill the third void space.

* * * * *